(12) United States Patent
Obrecht et al.

(10) Patent No.: US 10,748,762 B2
(45) Date of Patent: Aug. 18, 2020

(54) PROCESS FOR FABRICATING AT LEAST ONE SEMICONDUCTOR STRUCTURE COMPRISING A STEP OF SEPARATION RELATIVE TO THE GROWTH SUBSTRATE

(71) Applicant: Commissariat A L'Energie Atomique et aux Energies Alternatives, Paris (FR)

(72) Inventors: Remy Obrecht, Grenoble (FR); Carole Pernel, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/508,503

(22) Filed: Jul. 11, 2019

(65) Prior Publication Data

US 2020/0020527 A1    Jan. 16, 2020

(30) Foreign Application Priority Data

Jul. 13, 2018  (FR) ...................................... 18 56466

(51) Int. Cl.
*H01L 21/02* (2006.01)
*H01L 33/00* (2010.01)

(52) U.S. Cl.
CPC .... *H01L 21/02458* (2013.01); *H01L 21/0243* (2013.01); *H01L 21/0254* (2013.01);
(Continued)

(58) Field of Classification Search
CPC ......... H01L 21/02458; H01L 21/02389; H01L 21/0243; H01L 21/02499; H01L 21/02502;
(Continued)

(56) References Cited

U.S. PATENT DOCUMENTS 6,956,246 B1   10/2005  Epler et al.
2006/0014310 A1   1/2006  Epler et al.
(Continued)

FOREIGN PATENT DOCUMENTS

EP   2 770 545 A2   8/2014

OTHER PUBLICATIONS

French Preliminary Search Report dated Mar. 5, 2019 in French Application 18 56466, filed on Jul. 13, 2018 (with English Translation of Categories of Cited Documents & Written Opinion).
(Continued)

*Primary Examiner* — Matthew L Reames
(74) *Attorney, Agent, or Firm* — Oblon, McClelland, Maier & Neustadt, L.L.P.

(57) ABSTRACT

The invention relates to a process for fabricating at least one semiconductor structure (20) separated from a support substrate (11), comprising the following steps:
- producing a two-dimensional nucleation layer (13) starting from the support substrate (11),
- producing the semiconductor structure (20) by epitaxy starting from the nucleation layer,
- obtaining a first electrode (30) located in a lateral zone (3) which borders the semiconductor structure;
- placing the structure thus obtained in an aqueous electrolytic bath (50);
- applying a potential difference between the electrodes (30, 40) until the separation of the semiconductor structure (20) relative to the support substrate (11) is brought about.

9 Claims, 4 Drawing Sheets

(52) U.S. Cl.
CPC .. *H01L 21/02389* (2013.01); *H01L 21/02499* (2013.01); *H01L 21/02502* (2013.01); *H01L 33/0075* (2013.01); *H01L 33/0079* (2013.01)

(58) Field of Classification Search
CPC ............. H01L 21/0254; H01L 33/0075; H01L 33/0079
See application file for complete search history.

(56) References Cited

U.S. PATENT DOCUMENTS

2011/0223749 A1 9/2011 Shiomi et al.
2014/0239310 A1 8/2014 Rho et al.

OTHER PUBLICATIONS

Das, S, et al., "A Self-Limiting Electro-Ablation Technique for the Top-Down Synthesis of Large-Area Monolayer Flakes of 2D Materials", Scientific Reports, vol. 6, No. 1, Jun. 21, 2016, 9 pages.

Avasarala, B, et al., "Electrochemical oxidation behavior of titanium nitride based electrocatalysts under PEM fuel cell conditions", Electrochimica Acta, 2010, pp. 9024-9034.

Kim, J, et al., "Principle of direct van der Waals epitaxy of single-crystalline films on epitaxial graphene", Nature Communications, Sep. 11, 2014, 7 pages.

PROCESS FOR FABRICATING AT LEAST ONE SEMICONDUCTOR STRUCTURE COMPRISING A STEP OF SEPARATION RELATIVE TO THE GROWTH SUBSTRATE

TECHNICAL FIELD

The field of the invention relates to the fabrication of at least one semiconductor structure by van der Waals epitaxy, comprising a step of separating the epitaxially grown semiconductor structure(s) relative to the growth substrate.

PRIOR ART

Generally, the epitaxy of a crystalline material from a nucleation layer of a growth substrate corresponds to the growth of this material so that its crystal lattice has an epitaxial relationship with that of the underlying material. In other words, the epitaxial material has an alignment of the crystallographic orientations of its crystal lattice, in at least one direction within the plane of the material, and in at least one direction orthogonal to the plane of the material, with those of the crystal lattice of the nucleation material. The plane of the epitaxially-grown material is here parallel to the nucleation plane. This results in the fact that there is a match of crystallographic orientation and position between the crystal lattice of the epitaxially-grown material and that of the nucleation material.

However, when the crystalline material has a lattice parameter different from that of the nucleation material, the epitaxially-grown material then has a deformation of its crystal lattice, so that it is then subjected to tensile or compressive mechanical stresses. Furthermore, when the thickness of the epitaxially-grown material exceeds a so-called critical thickness value, the mechanical stresses may relax plastically, then resulting in the formation of structural defects such as lattice mismatch dislocations. The crystalline quality of the epitaxially-grown layer may then be degraded.

By way of example, the epitaxial growth of a crystalline layer to give a III-N compound, for example gallium nitride GaN or indium gallium nitride InGaN, may be carried out, inter alia, starting from a substrate made of sapphire ($Al_2O_3$) or of silicon. However, GaN has a lattice mismatch of the order of 15% with sapphire, and also significant difference in the thermal expansion coefficient. Epitaxially-grown GaN then has mechanical stresses which, starting from a critical thickness of the layer, may relax plastically forming dislocations. Such structural defects are capable of degrading the optical and/or electronic properties of a microelectronic or optoelectronic device comprising such an epitaxially-grown layer.

For the purpose of reducing the density of the structural defects, the article by Kim et al. entitled *Principle of direct van der Waals epitaxy of single-crystalline films on epitaxial graphene*, Nat. Comm. 2014, 5: 4836 describes the fabrication of a light-emitting diode based on GaN by epitaxy starting from a nucleation layer made of a two-dimensional material, here graphene, this being formed on a support substrate made of silicon carbide SiC. The epitaxial growth is referred to as being of van der Waals type in so far as the GaN layer epitaxially-grown from the the nucleation layer does not have epitaxial relationships with the latter.

The light-emitting diode obtained is then separated from its growth substrate by a mechanical separation step. More specifically, a stressor layer made of nickel is deposited on the upper surface of the light-emitting diode, and also a handling layer. The nickel layer then imposes mechanical stresses in the light-emitting diode which give rise to the mechanical separation of the latter relative to the growth substrate. The separation is said to be mechanical in so far as it is obtained by the generation of mechanical stresses in the light-emitting diode such that their energy is greater than the energy of the van der Waals bonds between the light-emitting diode and the growth substrate. However, the mechanical stresses generated in the light-emitting diode by a stressor layer are capable of inducing a degradation of the optical and/or electronic properties of the light-emitting diode.

SUMMARY OF THE INVENTION

The objective of the invention is to at least partly overcome the drawbacks of the prior art, and more particularly to propose a process for fabricating at least one semiconductor structure by van der Waals epitaxy, comprising a step of separating the semiconductor structure relative to its growth substrate, so that the optical and/or electronic properties of the semiconductor structure are substantially preserved following the separation step.

More specifically, the subject of the invention is a process for fabricating at least one semiconductor structure separated from a support substrate, comprising the following steps:

i) producing, starting from a support substrate, a nucleation layer formed of a two-dimensional material comprising at least three monolayers;

ii) producing, by epitaxy starting from the nucleation layer, at least one semiconductor structure, so as to be bordered by a lateral zone in which the nucleation layer has a free surface;

iii) obtaining a conductive surface of a first electrode, located in said lateral zone and different from said free surface;

iv) placing the structure thus obtained in an aqueous electrolytic bath, in which is placed a second electrode, the aqueous electrolyte then coming into contact, in the lateral zone, with the free surface of the nucleation layer and with the conductive surface of the first electrode;

v) applying a potential difference between said electrodes, suitable for causing the formation of hydroxyl radicals at the interface between the conductive surface and the aqueous electrolyte, which then react with the free surface of the nucleation layer until the separation of the semiconductor structure relative to the support substrate is brought about.

The two-dimensional material is formed of a stack of at least three monolayers, including at least one interlayer monolayer. Each monolayer, or sheet, is formed of a two-dimensional crystal lattice. Furthermore, an upper face of the support substrate, on which the nucleation layer rests, comprises a first surface not covered by the nucleation layer. Also, the free surface of the nucleation layer has an upper face (parallel to the upper face of the support substrate) and a lateral edge.

Certain preferred but nonlimiting aspects of this process are the following.

Preferably, following step i) of producing the nucleation layer, an upper face of the support substrate, on which the nucleation layer rests, comprises a first surface not covered by the nucleation layer.

Preferably, the step iii) of obtaining the conductive surface comprises the production of a metal portion forming the first electrode, located in the lateral zone and in contact with the first surface of the support substrate.

The conductive surface of the first electrode may be located at a distance from the free surface of the nucleation layer.

The first surface may be defined by an electrically conductive material of the support substrate which forms the first electrode, the first surface then forming the conductive surface.

The two-dimensional material may be electrically conductive and the nucleation layer may form the first electrode, the free surface of the nucleation layer then forming the conductive surface.

During step ii) of producing the semiconductor structure, the latter may partially cover the nucleation layer, so that the free surface of the nucleation layer is formed at least in part by a portion of the so-called upper face thereof opposite the support substrate.

The two-dimensional material of the nucleation layer may be selected from transition metal chalcogenides, graphene, and boron nitride.

The semiconductor structure may be a diode suitable for emitting or detecting light, and may be produced using a III-V semiconductor compound or using a II-VI semiconductor compound.

During step ii), a plurality of semiconductor structures may be produced from nucleation layers formed of the two-dimensional material and different from one another, each semiconductor structure being bordered by a lateral zone, in which is located: a conductive surface, and a first surface of the upper face of the support substrate, the first surface not being covered by the nucleation layer.

During step ii), a plurality of semiconductor structures may be produced, then, at least one of said semiconductor structures may be separated from the support substrate selectively, by applying a potential difference between a first electrode located in the lateral zone that borders the semiconductor structure to be separated, and the second electrode. The expression "selective separation" is understood to mean that the semiconductor structure is separated whereas other semiconductor structures are not separated. Only the first electrode located in the lateral zone of the semiconductor structure to be separated is polarized. The first electrodes located in the lateral zones of the semiconductor structures that are not separated are then not polarized. The first electrodes are thus different and may be polarized independently of one another.

BRIEF DESCRIPTION OF THE DRAWINGS

Other aspects, objectives, advantages and features of the invention will become more apparent on reading the following detailed description of preferred embodiments thereof, given by way of nonlimiting example and with reference to the appended drawings in which.

DETAILED DESCRIPTION OF PARTICULAR EMBODIMENTS

In the figures and in the remainder of the description, the same references represent identical or similar elements. Furthermore, the various elements are not represented to scale so as to promote the clarity of the figures. Furthermore, the various embodiments and variants are not mutually exclusive and may be combined together. Unless otherwise indicated, the terms "substantially", "around", "of the order of" mean to within 10%. Furthermore, the expression "comprising a" should be understood as "comprising at least one", unless otherwise indicated.

The invention relates to a process for fabricating at least one semiconductor structure by van der Waals epitaxy, starting from a growth substrate comprising a nucleation layer made of a two-dimensional material. The process comprises a step of separating the semiconductor structure(s) relative to the growth substrate, and in particular relative to a support substrate of the latter. As described in detail further on, the separation step uses a phenomenon of electrochemical ablation of the nucleation layer.

Generally, epitaxy of van der Waals type, also referred to as van der Waals epitaxy, is a heteroepitaxy technique by which a crystalline semiconductor layer is bonded to a nucleation layer formed of one or more monolayers of a two-dimensional material by van der Waals type bonds and not by covalent bonds. Van der Waals epitaxy makes it possible in particular to avoid the lattice mismatch that may exist between the two-dimensional material and the epitaxially-grown crystalline layer, this lattice mismatch resulting from the difference between the lattice parameters of the two materials, which thus makes it possible to obtain a relaxed or quasi-relaxed epitaxially-grown crystalline layer. Such a crystalline layer obtained by van der Waals epitaxy then has a reduced density of structural defects such as lattice mismatch dislocations, thus optimizing the optical and/or electronic properties of the semiconductor structure comprising such an epitaxially-grown crystalline layer.

The material of the nucleation layer is a crystalline material referred to as being two-dimensional in so far as it is formed of a monolayer or of several monolayers stacked on one another, each monolayer (also referred to as sheet) being formed of atoms or molecules arranged so as to form a two-dimensional crystal lattice. In other words, the crystal lattice of each monolayer extends along two directions and not along the three directions of space. The crystal lattice of one monolayer is therefore different from that of an adjacent monolayer. A monolayer is a two-dimensional crystalline structure of monatomic thickness, and is bonded to the adjacent monolayer(s) by a van der Waals force and not by a covalent bond. The two-dimensional material may be selected from transition metal chalcogenides, such as the sulfide or selenide of molybdenum ($MoS_2$, $MoSe_2$) or of tungsten ($WS_2$), graphene, boron nitride (in particular hexagonal boron nitride), inter alia. Within the context of the invention, the two-dimensional material comprises at least three monolayers, i.e. it is formed of a stack of at least three monolayers, namely a so-called lower monolayer in contact with a support substrate, a so-called upper monolayer in contact with the semiconductor structure(s), and one or more so-called interlayer monolayers, located between the lower and upper monolayers. Such a two-dimensional material is therefore different from the crystalline compounds for which the crystal lattice is three-dimensional.

As described in detail below, the separation of the semiconductor structure(s) relative to the growth substrate is carried out by electrochemical ablation of the nucleation layer. Electrochemical ablation is understood to mean a reaction between a species formed electrochemically and controlled by a potential and the two-dimensional material of the nucleation layer leading to the partial or complete removal of at least one monolayer of the nucleation layer, in particular of at least one interlayer monolayer. This electrochemical ablation reaction thus differs from a mechanical exfoliation action, in which the semiconductor structure is detached or separated mechanically from the growth substrate by generating mechanical stresses in the latter, which stresses are liable to lead to a degradation of the optical and/or electronic properties of the semiconductor structure.

In the remainder of the description, the semiconductor structure(s) may be microelectronic or optoelectronic devices. They may thus be, purely by way of illustration, light-emitting diodes or photodiodes, for example produced predominantly using a III-V semiconductor compound such as GaN. In other words, the semiconductor structure is made from a material of which at least 50% of its volume is formed of or comprises GaN or an alloy of GaN, for example InGaN or AlGaN.

FIGS. 1A to 1K are schematic and partial views, in cross section, of various steps of a process for the collective fabrication of semiconductor structures 20 according to one embodiment. In this example, the semiconductor structure 20 is a light-emitting diode produced using InGaN.

Defined here and for the remainder of the description is an orthogonal three-dimensional direct coordinate system (X,Y, Z), where the X and Y axes form a plane parallel to the main plane of the support substrate 11, and where the Z axis is oriented substantially orthogonally to the main plane of the support substrate 11. In the remainder of the description, the terms "lower" and "upper" are understood as being relative to a position that increases on moving away from the support substrate 11 along the +Z direction.

Figure 1A:
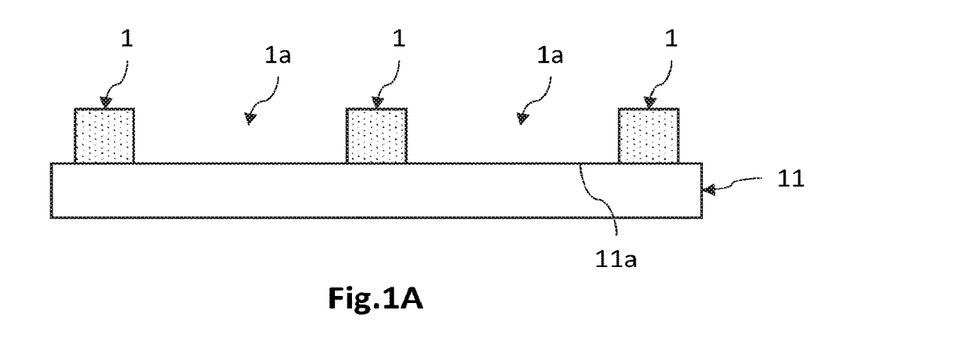
FIGS. 1A to 1K illustrate various steps of a process for collective fabrication of several semiconductor structures, according to one embodiment, comprising a step of separating said structures relative to the growth substrate.
Figure 1B:
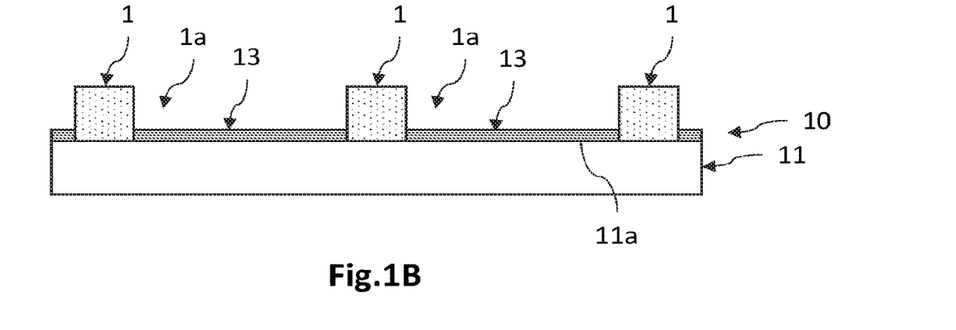

With reference to FIGS. 1A and 1B, a growth substrate to is firstly produced which comprises a support substrate 11 coated at least partly by a nucleation layer 13.

The support substrate 11 comprises an upper face 11$a$ intended to receive the nucleation layer 13. It may be made of the same material, and may thus be a bulk substrate, or be formed of a stack of several layers of different materials, such as a SOI substrate (Silicon On Insulator). The material defining the upper face 11$a$ may be electrically insulating or conductive. By way of example, one such insulating material may be selected from sapphire ($Al_2O_3$), borosilicate, silica, glass, quartz, an oxide or a nitride of silicon or of aluminium, inter alia.

It may be made of a conductive material such as an optionally doped semiconductor. By way of example, one such semiconductor material may be selected from silicon, germanium, silicon carbide, or more broadly a III-V compound comprising at least one element from column III and at least one element from column V of the Periodic Table, a II-VI compound, or an IV element or compound. By way of example, III-V compounds may be III-N compounds, such as GaN, InGaN, AlN, InN or AlInGaN, or compounds comprising an element from column V, for example AsGa or InP. II-VI compounds may be CdTe, HgTe, CdHgTe, ZnO, ZnMgO, CdZnO or CdZnMgO. Finally, IV elements or compounds may be Si, C, Ge, SiC, SiGe, GeC, inter alia. The semiconductor material may be doped in order to increase its electrical conductivity. Finally, the material of the support substrate 11 defining the upper face 11$a$ may be selected from metallic materials (Ti, Au, TiAu, etc.) and semi-metallic materials (TiN, etc.). Preferably, the support substrate 11 is here a monoblock substrate made of sapphire.

Produced next, on the upper face 11$a$, is a first growth mask 1, intended to subsequently define a free surface of the upper face 11$a$ of the support substrate 11 that may receive a work electrode. For this purpose, a dielectric layer is deposited on the upper face 11$a$ of the support substrate 11. The dielectric layer is made of at least one electrically insulating material, for example a silicon oxide or nitride, such as $SiO_2$ or $Si_3N_4$, or even a silicon oxynitride, an aluminium oxide, or a hafnium oxide. It may have a dimension along the Z axis, i.e. a thickness, between a few hundred nanometres and a few microns or tens of microns, for example equal to around 10 µm.

Produced next, by photolithography and etching techniques, are through-openings 1$a$ in the dielectric layer, so as to locally render surfaces of the upper face 11$a$ of the support substrate 11, that are intended to receive the nucleation layer 13, free. A free surface is understood to mean a surface not coated by another material. The localized first growth mask 1 then forms a network of dielectric strips. The free surfaces may have, in the XY plane, a circular, oval or polygonal shape, for example a square or rectangular shape. By way of example, they have a square shape with sides of around 100 µm. The dimensions of the free surface depend in particular on those of the semiconductor structures that it is desired to fabricate. Each dielectric strip 1 has an initial width, i.e. the transverse dimension thereof in the XY plane and orthogonal to the longitudinal dimension thereof, of the order of a few microns or tens of microns. By way of example, the dielectric strips 1 have an initial thickness equal to around 15 µm and an initial width equal to around 15 µm. The initial width of the dielectric strips depends in particular on the dimensions of the work electrode intended to be produced subsequently.

Next the nucleation layer 13 is deposited on the free surfaces of the upper face 11$a$ of the support substrate 11 (FIG. 1B). The nucleation layer 13 may be deposited by molecular beam epitaxy (MBE). Other deposition techniques are possible, for example chemical vapour deposition (CVD) such as metal-organic chemical vapour deposition (MOCVD), or any other suitable deposition technique. In this example, the nucleation layer 13 is made of tungsten sulfide $WS_2$ which is particularly suitable for the nucleation of a semiconductor compound based on InGaN. It is formed of a stack of at least three monolayers, namely a lower monolayer in contact with the upper face 11$a$, at least one interlayer monolayer, and an upper monolayer. The nucleation layer 13 has, preferably, a chosen number of monolayers chosen so that the separation of the semiconductor structures 20 relative to the support substrate 11 by electrochemical ablation is carried out before these structures are oxidized, where appropriate.

With reference to FIGS. 1C to 1F, the semiconductor structures 20 are produced next by van der Waals epitaxy. These structures are produced so as to define a lateral zone 3 which surrounds the semiconductor structures 20 in which zone a free surface 14 of the nucleation layer 13 and a conductive surface 31 of a work electrode 30 are intended to be located.

Figure 1C:
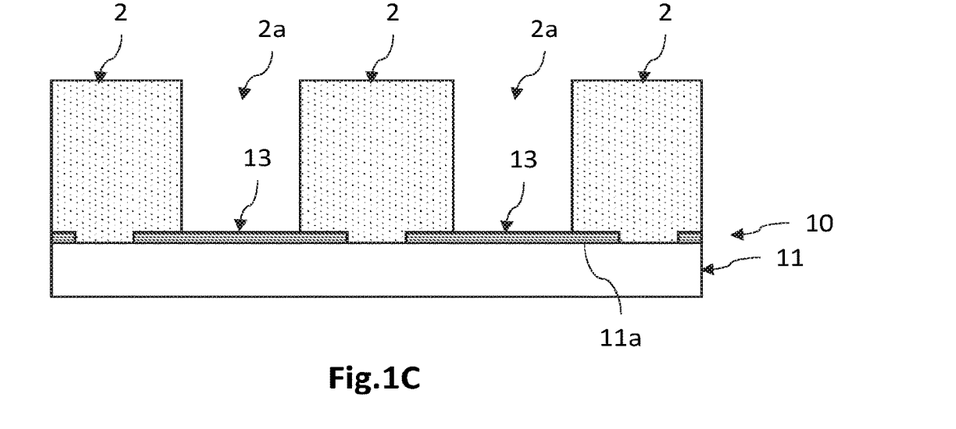

For this purpose, a broadening of the first growth mask 1 is then carried out so as to partially cover the upper face of the nucleation layer 13 (FIG. 1C). This broadening is advantageous for obtaining a free surface 14 of the nucleation layer 13 making it possible to optimize the electrochemical ablation reaction during the separation step. Furthermore, the growth mask 2 has here a final thickness greater than the initial thickness of the growth mask 1, the value of the final thickness being dependent on the desired dimensions of the semiconductor structures 20. Also, a second dielectric layer is deposited so as to completely cover the nucleation layer 13 and the first growth mask 1. The second dielectric layer is preferably made from a material identical to that of the first growth mask, and has a thickness substantially equal to the desired final value.

Produced next, by photolithography and etching techniques, are through-openings 2a in the second dielectric layer, so as to locally render a surface of the nucleation layers 13 free. Each dielectric strip 2 has the final thickness, and a final width greater than the initial width of the growth mask 1. In other words, each dielectric strip 2 of the growth mask covers laterally, i.e. transversely to the longitudinal expanse thereof, a portion of the nucleation layer 13. This covered portion is intended to form the free surface 14 of the nucleation layer 13. Furthermore, the dielectric strips 2 are intended to subsequently form the lateral zone 3 in which the free surface 14 of the nucleation layer 13 and the conductive surface 31 of the work electrode 30 will be located.

The section of the through-openings 2a in the XY plane may have various shapes, for example circular, oval, polygonal, for example square or rectangular. The through-openings 2a may have lateral dimensions, in the XY plane, between a few hundred nanometres and a few millimetres, depending on the targeted applications. In this example, the nucleation surface has a square shape with sides of 50 µm, and the dielectric strips 2 have a final width of around 65 µm.

Figure 1D:
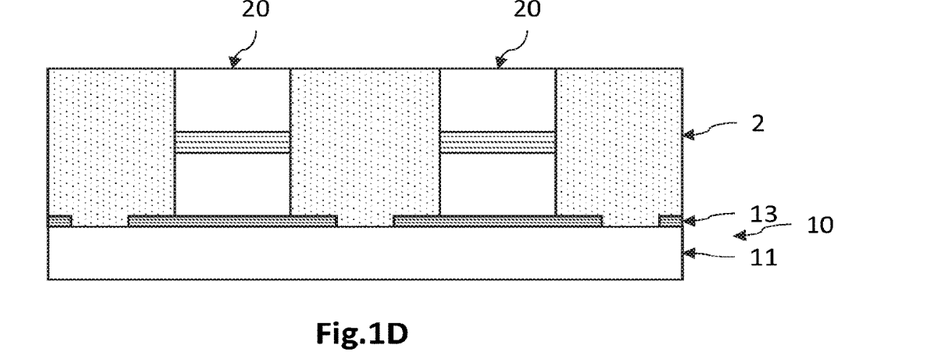

Next, the semiconductor structures 20 are produced in the through-openings 2a of the growth mask 2, by van der Waals epitaxial growth starting from the nucleation surfaces (FIG. 1D). In this example, the semiconductor structures 20 are stacks of semiconductor layers produced using InGaN and forming a p-n junction, which are intended to form light-emitting diodes.

The epitaxial growth of the semiconductor structures 20 may be carried out by conventional epitaxy techniques, such as CVD deposition, for example MOCVD, MBE epitaxy, HVPE epitaxy, atomic layer epitaxy (ALE), atomic layer deposition (ALD), or even by evaporation or sputtering. By way of illustration, the semiconductor structures 20 are produced using InGaN by MOCVD chemical deposition.

By way of illustration, each semiconductor structure 20 comprises here, starting from the nucleation surface, an intrinsic InGaN portion 21 (not intentionally doped), a first doped portion 22 which is doped according to a first type of conductivity, for example of n type, an active zone 23 formed of several quantum wells each intercalated between two barrier layers, and a second doped portion 24 which is doped according to a second type of conductivity opposite to the first type, for example of p type. The types of conductivity may be reversed. Other layers (not represented) may be provided, for example an electron blocking layer located between the active zone and the p-doped portion and an excessively p-doped portion intended to facilitate the injection of the charge carriers from an electrical contact.

The semiconductor structures 20 are here produced collectively, i.e. simultaneously, so that the doped portions 22, 24 and the active zone 23 of each semiconductor structure 20 advantageously have substantially the same characteristics in terms of dimensions, composition, and doping level.

Since the intrinsic InGaN portion 21 is produced by van der Waals epitaxy starting from the two-dimensional material of the nucleation layer 13, it has a crystal lattice that is not mechanically stressed by that of the nucleation layer 13, nor by that of the support substrate 11. Thus, the effective lattice parameter of the material of the intrinsic InGaN portion 21 is substantially equal to its value in the natural (unstressed) state. This results in a good relaxation of the mechanical stresses of the material of the intrinsic InGaN portion throughout its thickness, thus leading to a low density of structural defects such as lattice mismatch dislocations resulting from a possible plastic relaxation of the stresses. Thus, it is then possible to produce doped portions 22, 23, 24 forming the p-n junction, the thickness of which is no longer limited by the critical thickness starting from which a plastic relaxation of the mechanical stresses customarily appears, thus improving the internal quantum efficiency of the semiconductor structures 20 of light-emitting diode or photodiode type. Furthermore, in the case where the base material of the semiconductor structure 20 is a ternary or quaternary compound based on GaN, such as InGaN, it is then possible to incorporate a large amount of indium and thus to obtain an alloy in which the atomic proportion of indium is particularly high, then making it possible to emit in the green (spectral band between 495 nm and 560 nm), or even in the red (spectral band between 600 nm and 650 nm). In the case of a photodiode based on AlGaN, a high atomic proportion of aluminium makes it possible to absorb light radiation in the ultraviolet (spectral band between 100 nm and 400 nm).

Figure 1E:
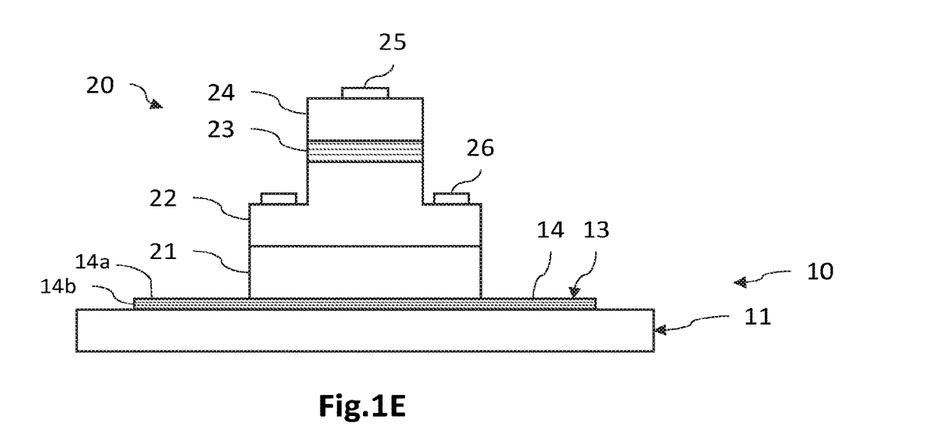

It is then possible to produce (FIG. 1E) the electrical contacts 25, 26 enabling the injection of the charge carriers into the semiconductor structure 20. In this example, the lateral sidewalls of the p-doped portion 24, of the active zone 23, and of a part of the n-doped portion 22 are etched so as to form a recess that receives a first electrical contact 26. A lateral sidewall is understood to mean a surface which laterally defines, in the XY plane, an element, this surface possibly being oriented substantially parallel to the Z axis. Furthermore, a second electrical contact 25, for example made of a material transparent to the emitted light radiation of the diode, is deposited on the upper face of the p-doped portion 24. In FIG. 1E, for the sake of clarity, the semiconductor structure 20 has an aspect ratio which does not necessarily correspond to the actual aspect ratio. Furthermore, the growth mask 2 is not represented. Thus, the semiconductor structure 20 may have a thickness of the order of a few microns to tens or hundreds of microns, whilst its lateral dimensions may range up to a few millimetres.

Figure 1F:
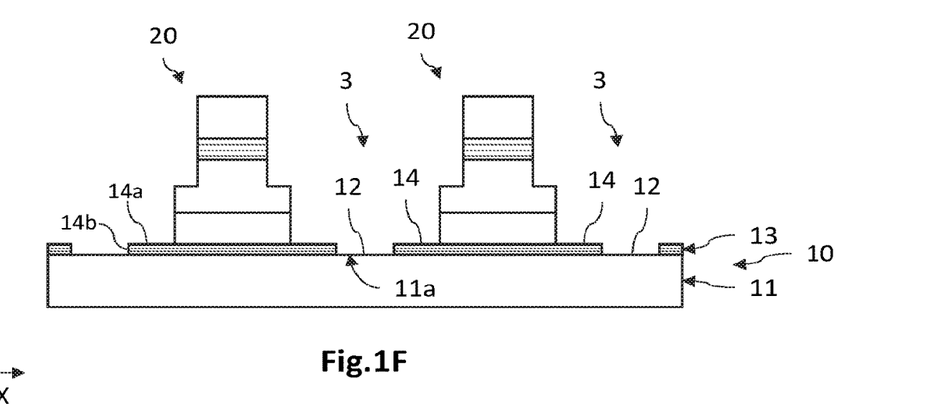

Next, the removal of the growth mask 2 is carried out (FIG. 1F). Thus, a plurality of semiconductor structures 20 separate from one another is obtained. They are bordered, i.e. surrounded, by a lateral zone 3 which extends between the facing lateral sidewalls of two adjacent semiconductor structures 20. The semiconductor structures 20 cover only a portion of the nucleation layers 13, so that the latter have a free surface 14 in each lateral zone 3. Furthermore, the upper face 11a of the support substrate 11 has a free surface 12 located between two adjacent nucleation layers 13. This free surface 12 is intended to receive a work electrode 30. The free surface 14 of each nucleation layer 13 has an upper face 14a on the opposite side to the support substrate 11, and a lateral edge 14b that defines the periphery of the nucleation layer 13.

Figure 1G:
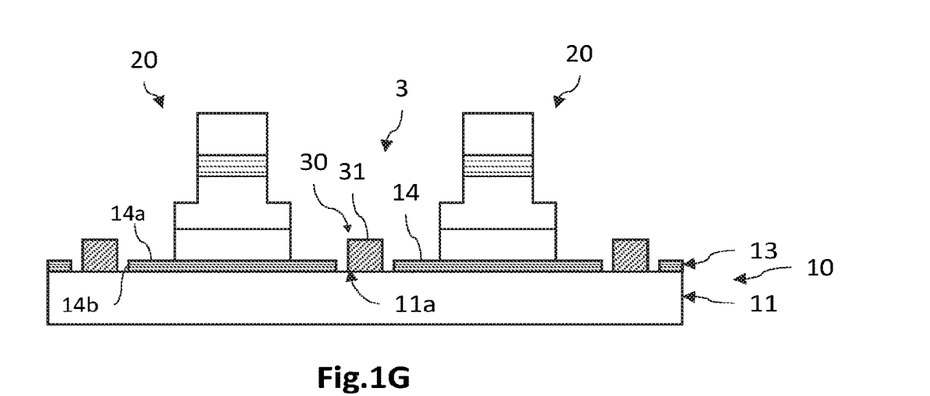
Figure 1H:
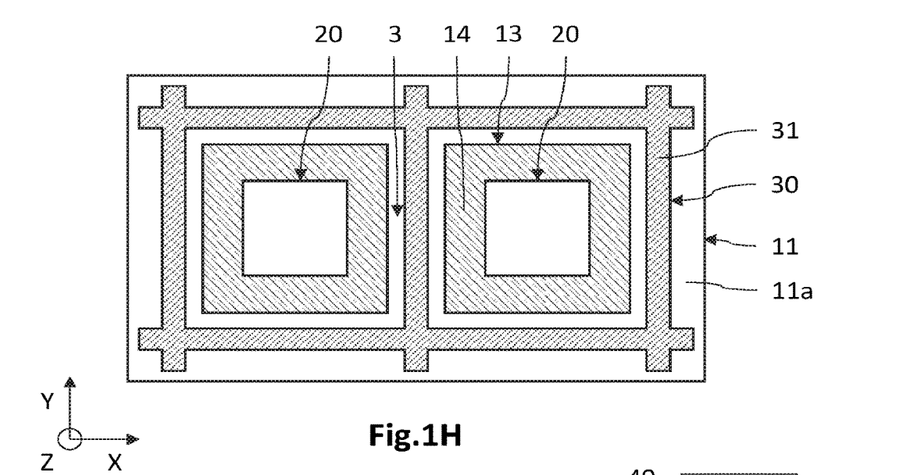

With reference to FIGS. 1G and 1H, next the work electrode 30 that rests on the support substrate 11 is produced (FIG. 1G). This electrode is located in the lateral zone 3, and arranged so as to leave free, partially or completely, the free surface 14 of the nucleation layer 13. The work electrode 30 thus comprises a conductive surface 31, separate from the nucleation layer 13 and from the semiconductor structures 20. In this example, there is no physical contact between the work electrode 30 and the nucleation layers 13, so that the free surface 14 is not coated by the work electrode 30, neither at the upper face 14a thereof nor at the lateral edge 14b thereof.

The work electrode 30 is made of an electrically conductive material. The material may be a metal, for example selected from Au, Pt, TiAu, TiN etc. it may also be the two-dimensional material of the nucleation layer 13 when it is electrically conductive, or even the material of the support substrate 11 defining the upper face 11a when it is electrically conductive.

In this example, the work electrode 30 forms a network of conductive strips (FIG. 1H) deposited in contact with the upper face 11a of the support substrate 11 and here at a distance from the nucleation layer 13. By way of example, the thickness and width dimensions of the conductive strips may be between a few hundred nanometres and a few microns. The work electrode 30 is electrically connected to a voltage source suitable for imposing a given electric potential thereon. Thus, the semiconductor structures 20 are bordered, in this case surrounded, by lateral zones in which a conductive surface 31 of the work electrode 30, and a free surface 14 of the nucleation layer 13 are located. The free surface 14 is here formed by a portion of the upper face 14a and by the lateral sidewalls 14b (lateral edge) of the nucleation layer 13. The conductive surface 31 is formed by the upper face and by the lateral sidewalls of the work electrode 30.

Figure 1I:
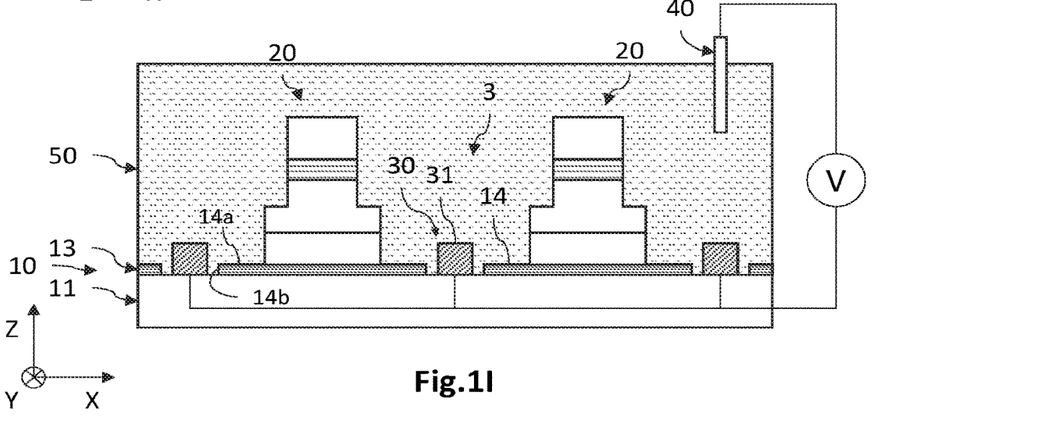

With reference to FIG. 1I, the structure thus obtained is placed in an aqueous electrolytic bath 50, in which is placed a second electrode, referred to as reference electrode 40, which has a set electric potential. Thus, the aqueous electrolyte 50 comes into contact, in the lateral zone 3, with the conductive surface 31 of the work electrode 30, and with the free surface 14 of the nucleation layer 13. The aqueous electrolyte 50 is an aqueous solution containing ions. It is chosen so as to have a sufficient electrical conductivity. Furthermore, it is chosen so as to be inert relative to the material(s) of the semiconductor structures 20, so as not to induce structural degradation. The aqueous electrolyte 50 may be acid and may have a pH for example equal to around 2. It may be 1M LiCl having a conductivity equal to 70 mS·cm. A counterelectrode, for example made of platinum, may be used (three-electrode assembly), and the reference electrode 40 may be made of Ag/AgCl or calomel (or any other reference electrode compatible with the electrolyte).

Figure 1J:
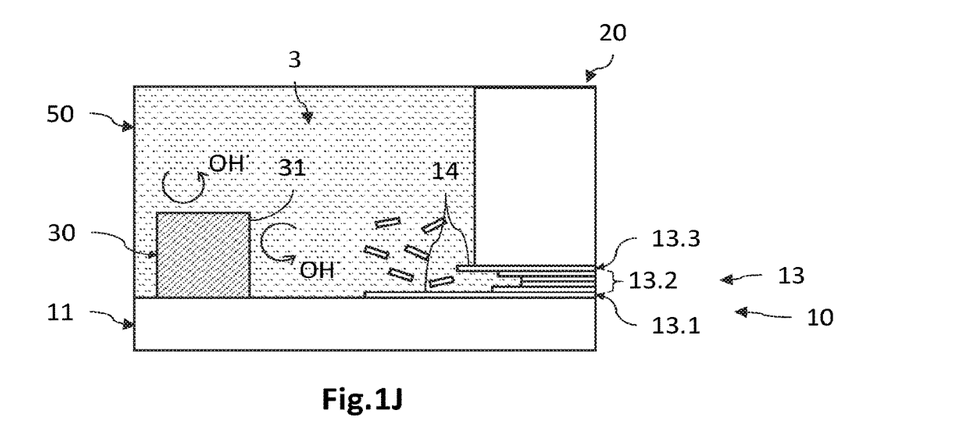
Figure 1K:
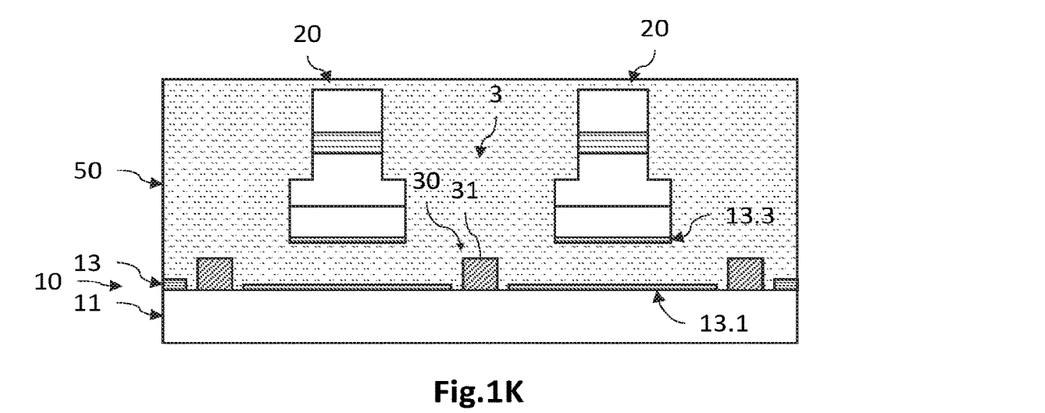

With reference to FIGS. 1J and 1K, next the separation of the semiconductor structures 20 relative to the growth substrate to is carried out. For this purpose, a potential difference is applied between the work electrode 30 and the reference electrode 40. The potential may be applied in continuous mode or in pulsed mode. The potential has a value sufficient to generate hydroxyl radicals HO. in the aqueous electrolyte 50, at the interface with the conductive surface 31 of the work electrode 30. This value varies as a function of the nature of the electrode and of the composition and pH of the electrolyte. The hydroxyl radicals correspond to free radicals HO., i.e. to the neutral form of hydroxide ions OH$^-$. This formation of hydroxyl radicals may be accompanied by an oxidation of the conductive surface 31, as indicated in the article by Avasarala et al. entitled *Electrochemical oxidation behavior of titanium nitride based electrocatalysts under PEM fuel cell conditions*, Electrochimica Acta, 55 (2010) 9024-9034, in the case of a TiN electrode under oxidizing conditions at a direct voltage of the order of 1.0 V to 1.5 V. In the case of a work electrode 30 made of a transition metal nitride, the generation of hydroxyl radicals may be accompanied by a formation of gaseous nitrogen $N_2$ capable of inducing a localized detachment of the nucleation layer 13, that may then improve the separation of the semiconductor structures 20 relative to the growth substrate 10. The separation is carried out by partial or complete degradation of at least one interlayer monolayer 13.2 of the two-dimensional material of the nucleation layer 13, starting from the free surface 14, and here starting from at least the lateral edge 14b thereof, via an electrochemical ablation phenomenon similar to that described in the article by Das et al. entitled *A Self-Limiting Electro-Ablation Technique for the Top-Down Synthesis of Large-Area Monolayer Flakes of 2D Materials*, Sci. Rep. 6, 28195 (2016). The minimum value of the electric potential imposed on the work electrode 30 to give rise to the generation of the hydroxyl radicals may be predetermined by a differential pulse voltammetry (DPV) method.

As FIG. 1J illustrates, owing to the high oxidizing power of the hydroxyl radicals, the latter directly attack the chemical bonds of the two-dimensional material (at the edge of the monolayers) starting from the free surface 14 of the nucleation layer 13, and here starting from the lateral edge 14b thereof. Thus, the hydroxyl radicals are adsorbed by the monolayers of the two-dimensional material, here starting from the lateral sidewall and from the free upper face of the nucleation layer 13, in particular via structural surface defects such as dislocations.

Similarly to the phenomenon described in the article by Das of 2016, the adsorption of the hydroxyl radicals gives rise to the gradual degradation of the interlayer monolayer(s) 13.2, by the formation of a plurality of sheets that separate from the nucleation layer 13. The sheets resulting from the interlayer monolayers 13.2 separate from the nucleation layer 13 all the more easily because their bond energy with the other monolayers is lower than that connecting the lower monolayer 13.1 to the support substrate 11, and lower than that connecting the upper monolayer 13.3 to the semiconductor structure 20. Thus, as the publication by Das et al. of 2016 indicates, the bond energy between a lower monolayer made of $MoS_2$ and a surface made of TiN, as an absolute value, is of the order of 1.25 eV, whereas it is of the order of 0.16 eV between the interlayer monolayers of this two-dimensional $MoS_2$ material.

As FIG. 1K illustrates, owing to the removal of at least one interlayer monolayer of the nucleation layer 13 associated with each semiconductor structure 20, the separation of the semiconductor structures 20 relative to the support substrate 11 is thus obtained. The semiconductor structures 20 may then be recovered with a view to finalising the fabrication of a functional optoelectronic system.

Thus, the fabrication process makes it possible to produce one or more semiconductor structures 20 by van der Waals epitaxy and to separate them from their growth substrate 10. The separation step takes advantage of an electrochemical ablation reaction of the nucleation layer 13 made of the two-dimensional material. Thus, the semiconductor structures 20 are not subjected to mechanical action as in the example of the prior art mentioned previously, which makes it possible to preserve their optical and/or electronic properties.

Particular embodiments have just been described. Various variants and modifications will be apparent to a person skilled in the art.

Figure 2:
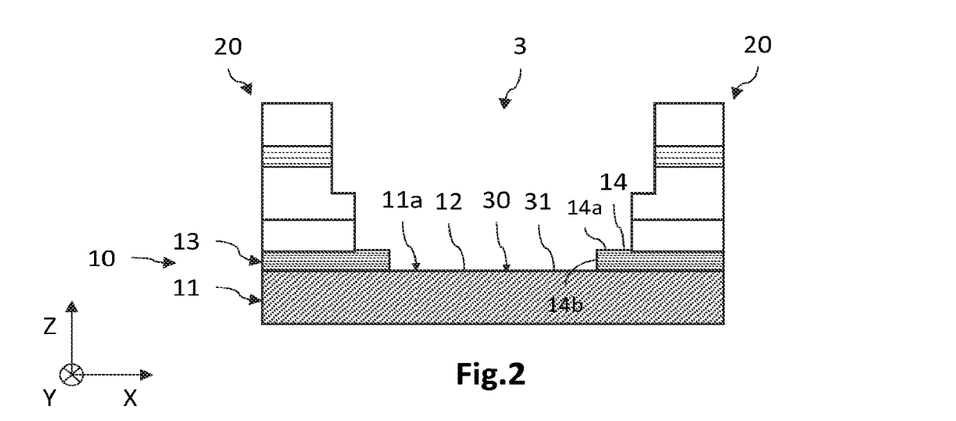
FIG. 2 is a schematic and partial view, in cross section, of a variant of FIG. 1G, in which the conductive surface of a work electrode is formed by the support substrate.

Thus, as FIG. 2 illustrates, the upper face 11a of the support substrate 11 may be defined by an electrically conductive material. Also, the free surface 12 of the support substrate 11, located in the lateral zone 3, may therefore form the conductive surface 31 of the work electrode 30. The latter may thus be the conductive material of the support substrate 11, electrically connected to the voltage source.

Furthermore, in the case where the upper face 11a of the support substrate 11 is defined by an electrically insulating material, the conductive surface 31 may be defined by the free surface 14 of the nucleation layer 13, in the case where the two-dimensional material is made from an electrically conductive material, such as for example graphene. The nucleation layer 13, in the lateral zone 3, may be separate from the adjacent nucleation layer 13, but as a variant, the various nucleation layers may form one and the same continuous nucleation layer 13.

Furthermore, as a variant of the fabrication process described previously with reference to FIGS. 1A to 1K, the various semiconductor structures 20 may, before the separation step, be joined together to one and the same secondary substrate (not represented), making it possible in particular to subsequently carry out the steps of structuring and forming the electrical contacts. Thus, the assembly obtained, formed of the growth substrate 10, semiconductor structures 20 and secondary substrate, is placed in the aqueous electrolyte 50 and the separation step is carried out as described previously. Thus, a plurality of semiconductor structures 20, separated from the growth substrate 10, and joined to the secondary substrate, are obtained.

Furthermore, it is possible to carry out the collective separation of the semiconductor structures 20, as described previously, or the selective separation of previously identified semiconductor structures 20. For this purpose, the work electrode 30 is formed of a plurality of conductive strips separate from one another. The polarization of one or more conductive strips adjacent to the identified semiconductor structure 20 makes it possible to separate said semiconductor structure 20 selectively. For this purpose, the sum of the voltages applied to the conductive strips adjacent to the chosen semiconductor structure makes it possible to achieve the potential necessary for the initiation of the electrochemical ablation reaction (therefore in the vicinity of the chosen structure).

The invention claimed is:

1. A process for fabricating at least one semiconductor structure separated from a support substrate, comprising the following steps:
   i) producing, starting from a support substrate, a nucleation layer formed of a two-dimensional material comprising at least three monolayers, including at least one interlayer monolayer, each monolayer being formed of a two-dimensional crystal lattice;
   ii) producing, by epitaxy starting from the nucleation layer, at least one semiconductor structure,
      so as to be bordered by a lateral zone in which the nucleation layer has a free surface,
      an upper face of the support substrate, on which the nucleation layer rests, comprising a first surface not covered by the nucleation layer, so that the free surface has an upper face and a lateral edge;
   iii) obtaining a conductive surface of a first electrode, located in said lateral zone and different from said free surface;
   iv) placing the structure thus obtained in an aqueous electrolytic bath, in which is placed a second electrode, the aqueous electrolyte then coming into contact, in the lateral zone, with the free surface of the nucleation layer and with the conductive surface of the first electrode;
   v) applying a potential difference between said electrodes, suitable for causing the formation of hydroxyl radicals at the interface between the conductive surface and the aqueous electrolyte, which then react with the upper face and the lateral edge of the free surface of the nucleation layer, then degrading at least one interlayer monolayer of the nucleation layer until the separation of the semiconductor structure relative to the support substrate is brought about.

2. The process according to claim 1, in which step iii) of obtaining the conductive surface comprises the production of a metal portion forming the first electrode, located in the lateral zone and in contact with the first surface of the support substrate.

3. The process according to claim 1, in which the conductive surface of the first electrode is located at a distance from the free surface of the nucleation layer.

4. The process according to claim 1, in which the first surface is defined by an electrically conductive material of the support substrate which forms the first electrode, the first surface then forming the conductive surface.

5. The process according to claim 1, in which, during step ii) of producing the semiconductor structure, the latter partially covers the nucleation layer, so that the free surface of the nucleation layer is formed at least in part by a portion of the so-called upper face thereof opposite the support substrate.

6. The process according to claim 1, in which the two-dimensional material of the nucleation layer is selected from transition metal chalcogenides, graphene, and boron nitride.

7. The process according to claim 1, in which the semiconductor structure is a diode suitable for emitting or detecting light, and is produced using a III-V semiconductor compound or using a II-VI semiconductor compound.

8. The process according to claim 1, in which, during step ii), a plurality of semiconductor structures is produced from nucleation layers formed of the two-dimensional material and different from one another, each semiconductor structure being bordered by a lateral zone, in which is located:
   a conductive surface, and
   a first surface of the upper face of the support substrate, the first surface not being covered by the nucleation layer.

9. The process according to claim 1, in which, during step ii), a plurality of semiconductor structures are produced, then, at least one of said semiconductor structures is separated from the support substrate selectively, by applying a potential difference between a first electrode located in the lateral zone that borders the semiconductor structure to be separated, and the second electrode.

* * * * *

UNITED STATES PATENT AND TRADEMARK OFFICE
CERTIFICATE OF CORRECTION

PATENT NO. : 10,748,762 B2
APPLICATION NO. : 16/508503
DATED : August 18, 2020
INVENTOR(S) : Remy Obrecht et al.

It is certified that error appears in the above-identified patent and that said Letters Patent is hereby corrected as shown below:

On the Title Page

Column 1, Item (51), under "Int. Cl.", Lines 1-3,
    *H01L 21/02*    (2006.01)
delete "*H01L 33/00*    (2006.01)" and insert -- *H01L 21/02*    (2006.01) --, In the Claims In Column 12, Claim 1, Line 3, delete "'electrode;" and insert -- electrode; and --, In Column 12, Claim 8, Line 41, delete "is" and insert -- are --.

Signed and Sealed this
Seventh Day of June, 2022

Katherine Kelly Vidal
*Director of the United States Patent and Trademark Office*